United States Patent [19]

Leuschner

[11] 4,306,185

[45] Dec. 15, 1981

[54] BREAKDOWN VOLTAGE PROTECTION CIRCUIT

[75] Inventor: Horst Leuschner, Austin, Tex.

[73] Assignee: Motorola, Inc., Schaumburg, Ill.

[21] Appl. No.: 165,167

[22] Filed: Jul. 1, 1980

[51] Int. Cl.³ .................... G05F 3/08; 361 18; 323 223;276;303;311;312;313

[52] U.S. Cl. .................... 323/312; 361/18; 323/276; 323/303

[58] Field of Search ........... 361/18; 323/223, 276, 323/303, 311, 312, 313

[56] References Cited

U.S. PATENT DOCUMENTS

| | | | |
|---|---|---|---|
| 3,806,742 | 4/1974 | Powell | 323/313 X |
| 3,823,332 | 7/1974 | Feryszka et al. | 323/313 X |
| 3,832,644 | 8/1974 | Nagata et al. | 323/313 X |
| 3,913,026 | 10/1975 | Koehler | 323/311 X |
| 4,174,535 | 11/1979 | Mueller et al. | 323/303 X |

*Primary Examiner*—William M. Shoop
*Attorney, Agent, or Firm*—John A. Fisher

[57] ABSTRACT

A self-tracking high voltage breakdown protection circuit is provided. A non-destructive reference voltage is established by a gated diode having the same breakdown and walkout characteristics as the integrated circuit devices to be protected. A source-follower configuration couples the reference voltage to the integrated circuit. Devices of the protection circuit are internally connected to make each self-protected.

10 Claims, 3 Drawing Figures

4,306,185

BREAKDOWN VOLTAGE PROTECTION CIRCUIT

BACKGROUND OF THE INVENTION

This invention relates in general to a voltage regulator circuit, and, more particularly, relates to a breakdown voltage protection circuit for limiting the voltage applied to a junction to a non-destructive value.

In the operation of a MOS circuit, overvoltages are sometimes inadvertently applied to the circuit. The circuit must be protected from these overvoltages to prevent degradation or destruction of the circuit.

Like any semiconductor junctions, the drain substrate or source substrate junctions of a MOS transistor are characterized by a breakdown voltage when reverse biased. At reverse voltages in excess of this breakdown voltage the critical field is exceeded, the junction is no longer rectifying, and the reverse current increases rapidly. In a MOS transistor the junction breakdown is very heavily influenced, however, by the presence of and bias on a gate electrode located in proximity to the junction. It is well known, for example, that for a MOS transistor with the gate at a lower voltage than the drain voltage (e.g. gate grounded) the drain substrate breakdown is significantly lower than that of a similar but ungated junction. The negative gate-to-drain bias (for N-channel transistors) inverts the weakly doped periphery or fringe of the drain junction, especially at the semiconductor surface where the electrostatic field is greatest. The gate bias causes a reduced radius of curvature of the drain junction at the surface and an increased doping gradient of the diffused drain region which in turn reduces the depletion width within the drain region. The net result is a lowering of the junction breakdown voltage because of resulting higher field strength.

An N-channel MOS transistor can also be viewed as a lateral NPN bipolar transistor in which the source becomes the emitter, the substrate becomes the base, and the drain becomes the collector. If the electric field at any point on the drain substrate junction exceeds the critical field, an avalanche breakdown of the junction occurs with a resulting current flow from drain to substrate. This substrate current causes a localized voltage drop in the substrate which can have a significant effect on device operation. If the localized voltage drop in the substrate is sufficient to forward bias the base emitter (substrate source) junction, the lateral NPN transistor is turned on. This results in a drastic increase in drain current and an associated drop in sustaining drain-to-source voltage. This current voltage characteristic is equivalent to the "switchback" characteristic of a bipolar transistor operated in the CEO mode. The excess drain current associated with the switchback of the lateral NPN transistor does not flow into the substrate, but instead flows into the source. That excess of drain current caused by the turn on of the lateral NPN transistor can cause a permanent failure of the device by locally heating and fusing together the source and drain junctions.

High voltages, that is, voltages in excess of the junction breakdown voltage and especially the breakdown voltage of the junction as modulated by the presence of an adversely biased gate electrode, are occasionally applied to a semiconductor circuit. This occasion is especially likely in such circuits as electrically programmable read-only memories (EPROM) which require voltages in the range of 25 volts or more for programming. In view of the possibility of such high voltages being applied to a semiconductor circuit, it is necessary to protect such circuits from damage or permanent failure which can be caused when breakdown voltages are exceeded.

It is therefore an object of this invention to provide a voltage regulating circuit which limits voltages to values which will not cause destruction of a circuit.

It is a further object of this invention to provide a voltage regulating circuit which provides high voltage junction breakdown protection having a desirable load-line feature.

It is another object of this invention to provide a self tracking breakdown protection circuit which allows application to a circuit of the maximum possible nondestructive voltage.

It is still another object of this invention to provide a voltage regulating circuit which tracks with changes in breakdown voltage of circuit devices.

SUMMARY OF THE INVENTION

The foregoing and other objects are achieved in the present invention through the use of a self-tracking high voltage breakdown protection circuit. In one embodiment of the invention a current source is connected in series with a reference voltage device. The reference voltage device comprises a gated PN junction; the PN junction is similar to drain substrate or source substrate junctions found in the rest of the circuit and the gate is held at ground potential. The voltage reference device thus provides a limiting voltage which is less than a specified voltage maximum and which is non-destructive to circuit devices. The reference device tracks with devices on the circuit that are to be protected. This limiting voltage gates a source follower device designed to have an approximately zero threshold voltage at a source substrate voltage near the reference voltage. The source follower couples the regulated voltage to the protected circuit devices.

DETAILED DESCRIPTION OF THE PREFERRED EMBODIMENTS

Figure 1:
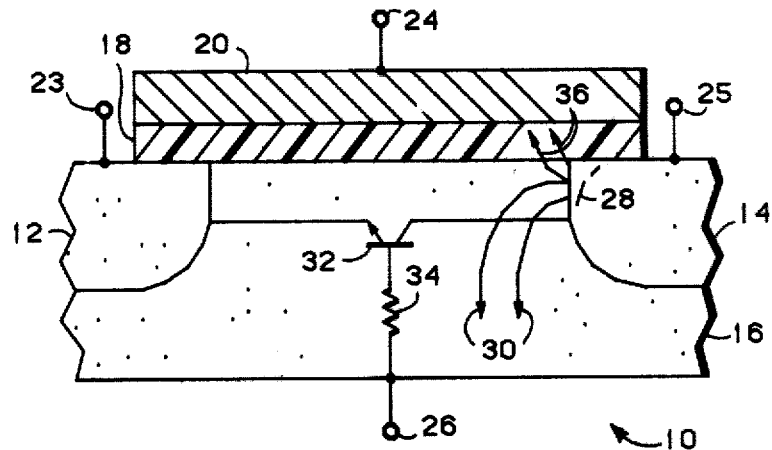
FIG. 1 illustrates in cross-section the current flows associated with a MOS transistor in breakdown.

FIG. 1 illustrates, in cross-section, a conventional N-channel MOS transistor 10. N-type regions 12, 14 are diffused into a p-type wafer 16 to form the source and drain regions, respectively. Each diffused region forms a PN junction with the substrate. A layer of insulator 18, such as silicon dioxide, forms the gate insulator of the MOS transistor. A gate electrode 20 overlies gate insulator 18. The gate electrode is typically either a metal such as aluminum or is doped polycrystalline silicon. Contacts 23, 24, 25 provide for electrical contact to the source, gate and drain, respectively, of the transistor. Contact 26 provides electrical connection to the substrate.

In a typical operation of MOS transistor 10, the source 12 and substrate 16 are maintained near ground potential. The drain 14 to substrate 16 junction is reverse biased by applying a positive potential to electrode 25. The gate electrode 24 is maintained at a potential between ground and a few volts positive and thus the gate is at a negative potential with respect to the drain.

As the reverse bias on the drain substrate junction increases, a voltage is reached at which avalanche breakdown occurs. Above that voltage the junction is no longer blocking and the reverse current increases rapidly with increases in reverse bias. For PN junctions found in conventional MOS integrated circuits, the breakdown voltage is inherently about 35–40 volts. This is determined by factors such as substrate impurity doping and depth of the diffused junction. In practice, however, this breakdown voltage is lowered to about 25–30 volts by the presence of the negative potential on the nearby gate electrode. The negative gate to drain potential inverts the weakly doped periphery of the drain junction, especially at the surface of the substrate where the electrostatic field is highest, and decreases the radius of curvature of the junction as indicated by the dashed line 28.

As avalanche breakdown of the drain substrate PN junction occurs, a breakdown current flows in the substrate as indicated by the arrows 30. The N-channel MOS transistor can also be viewed as a lateral NPN transistor 32. The avalanche current 30 flowing in the substrate can be enough to turn on this lateral transistor. Lateral transistor 32 is formed by the source acting as emitter, the drain acting as collector, and the substrate acting as the base. In series with the base is a resistor 34 resulting from the bulk resistance of the substrate. Avalanche current 30 causes a voltage drop in resistor 34 which can be of sufficient magnitude to forward bias the emitter-base junction of the NPN transistor. This base current is multiplied by the beta of the NPN transistor and can cause a CEO type switchback. The beta of the transistor is a function, for example, of the doping in the substrate (base) and the spacing between source and drain (emitter and collector). The switchback of the NPN transistor can result in a very rapid and usually destructive increase in current through the device.

As a result of the initial avalanche breakdown, a plasma of hot electrons and hot holes is generated. Because the gate electrode is at a potential which is negative with respect to the drain, some of the hot holes from the plasma are attracted toward the gate electrode through the gate insulator, as shown by the arrows 36, where many of them are trapped in charge traps. As the avalanche breakdown continues, the gate insulator acquires a localized positive charge near the location on the junction where the breakdown occurs. As the positive charge increases, it gradually shields the plasma from the negative gate potential so that the hole injection current into the insulator becomes self-limiting.

The trapped positive insulator charge reduces the gate-to-drain field which initially inverted the periphery of the N-type diffused drain region and which contributed to the reduced breakdown voltage of the junction. Thus, as the avalanche breakdown of the drain substrate junction continues, the gate insulator acquires a positive charge, the field strength across the insulator is reduced, and the drain surface inversion is reduced. This results in an increase in the breakdown voltage of the junction. This is the so-called "walkout" of the breakdown voltage; as the junction is avalanched, the breakdown voltage increases, approaching the inherent limiting breakdown characteristic of the junction alone.

The magnitude of the walkout is a function of the gate-to-drain voltage. No walkout occurs when the gate voltage is equal to the drain voltage. A significant amount of walkout occurs when the gate is strongly negative with respect to the drain. The speed with which the walkout occurs is a function of the plasma current density and also of the degree to which the charge traps in the gate insulator are already occupied.

The effect of walkout exhibits a short-term irreversibility. For example, if the breakdown voltage of the drain substrate junction of device 10 is walked out from an initial breakdown voltage of about 25 volts to a final breakdown voltage of about 35 volts the breakdown will remain at this value unless reduced, for example, by heating.

Although the speed of the walkout of the breakdown voltage is increased by increasing the breakdown current, the increase in speed is limited by the practical consideration that if a sufficient voltage drop in the substrate occurs, lateral NPN bipolar transistor 32 will be turned on and the resulting drain current will change from an avalanche current to a collector current which does not generate any more hot holes. Therefore, above a certain breakdown current limit no more walkout occurs because of the turn on of lateral transistor 32.

The gate modulated junction breakdown is generally non-destructive as long as the local thermal dissipation and the avalanche current density are not excessive. Destruction of the device usually occurs not from the simple junction breakdown, but from the switchback action of the associated bipolar lateral NPN transistor. MOS circuits can thus be protected and destruction of devices prevented by preventing the transistor switchback. Breakdown protection is afforded, in accordance with the invention, by a circuit which limits the voltage to be applied to circuit devices to a voltage value which is non-destructive. The circuit is self-tracking, that is the voltage limit is particularly adapted to the specific junction types found on the circuit and tracks as the breakdown of those junctions is walked out. The reference device of the breakdown protection circuit walks out in concert with other junctions in the circuit and the protection circuit is itself self-protected.

Figure 2:
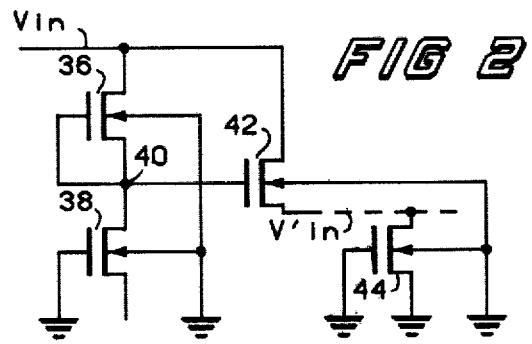
FIG. 2 schematically illustrates the breakdown protection circuit in accordance with the invention.

FIG. 2 illustrates a basic schematic of the self-tracking breakdown protection circuit in accordance with the invention. The circuit comprises a voltage regulator in which the reference voltage is established by current source or load 36 in series with a reference breakdown voltage device 38. The current source 36 can be, for example, an N-channel depletion mode MOS transistor. The drain of transistor 36 is coupled to the input voltage, $V_{in}$. The gate and source of transistor 36 are coupled together at node 40. Reference device 38 is schematically illustrated as an N-channel MOS transistor having its drain connected to node 40, its gate grounded, and no connection made to its source. In this configuration, reference device 38 is a gated diode, the drain substrate diode, with the gate grounded. The regulator is thus connected between $V_{in}$ and the substrate potential, here illustrated as ground potential. The reference device can walkout, but is not susceptible to switchback because no connection is made to the source and there is thus no parasitic lateral bipolar transistor.

MOS transistor 42 is a source follower with its drain connected to the input voltage, its gate connected to node 40, and its source conveying the regulated input voltage $V_{in}'$ to circuit transistors such as the MOS transistor 44. The source follower device 42 is fabricated to have a threshold voltage of approximately zero volts at a source substrate bias of about 25 volts.

As long as the input voltage $V_{in}$ is less than the gate modulated breakdown voltage of reference device 38 and of those transistors 44 to be protected, there is no drain current of transistor 38, and the source-to-drain voltage of transistor 36 is zero. The gate voltage of transistor 42 thus equals the input voltage $V_{in}$. Because device 42 has a near zero or negative threshold voltage at low source substrate voltages, the output voltage $V_{in}'$ will also equal the input voltage $V_{in}$. Thus, for any input voltage below the gate modulated breakdown voltage of reference device 38, the output voltage $V_{in}'$ will equal the input voltage $V_{in}$.

If the input voltage $V_{in}$ exceeds the breakdown voltage of reference device 38, the reference device will clamp the input voltage at this reference value and limit the output voltage $V_{in}'$ to a value approximately equal to the breakdown voltage. Under this condition, the gates of transistors 36 and 42 are at the breakdown voltage of reference device 38 so that transistors 36 and 42 have a much higher breakdown voltage than reference device 38 and will not break down themselves. This results since the gate modulated breakdown voltage of a junction will approach the regular junction diode breakdown voltage if the gate voltage is near the applied drain voltage. Additionally, only a few volts (the amount $V_{in}$ exceeds the reference device breakdown voltage) will appear from source to drain across transistors 36 and 42; these transistors will therefore not punch through even if they have very short channel lengths. Also, because the source and drain are approximately 25 volts above the substrate potential, neither device can exhibit switchback action by the turn on of the lateral bipolar transistor. There is insufficient voltage drop in the substrate to cause forward biasing of the base emitter junction.

Reference device 38 has been schematically illustrated in FIG. 2 as a MOS transistor with the source electrode open. In a preferred embodiment, the device is fabricated simply as a gated diode; no source junction is formed as it serves no function. The anode and cathode of the diode are formed by the drain and substrate, respectively. The gate electrode is tied to the cathode. The substrate is held at ground, or more generally at $V_{SS}$. The periphery of the diode junction is maximized to accommodate any reverse diode current and to reduce the impedance to any such current.

The reference device is formed by the same photolithographic and diffusion steps as are all other devices on the integrated circuit. The reference device will thus have the same breakdown characteristics as the active circuit devices. Breakdown characteristics, of course, also include walkout characteristics. Thus as the breakdown voltage of active circuit devices walks out, the breakdown voltage of the reference device will track, walking out by an equal amount. In devices such as the EPROM where the application of a high voltage is necessary for programming, the breakdown protection circuit will thus allow the application of the highest possible nondestructive voltage. If junctions are walked out and can tolerate a higher voltage, the protection circuit will accordingly also walk out to such higher voltage and will limit the applicable voltage to this higher value.

Present integrated circuits, depending upon complexity, are fabricated using various types of devices. Circuits may contain, for example, devices having a variety of different threshold voltages. The use of ion implants in the channel region, for example, allows the fabrication of devices having different levels of depletion or enhancement thresholds. Other "natural" devices may have no channel implant. The various types of devices may have slightly different breakdown voltage and walkout characteristics. The reference device is fabricated identically with the type of device which has the lowest breakdown voltage. If necessary, the reference device can be fabricated from several individual reference devices connected in parallel, each individual reference device being fabricated identically with one of the active circuit devices. In this manner, the reference device will have breakdown voltage characteristics which track with the actual active circuit device which has the lowest breakdown characteristics.

The source follower device is fabricated, for example by using ion implantation threshold adjustment techniques, to have a threshold voltage close to zero at a source substrate reverse bias voltage in the range of about 24 to 30 volts. This provides a favorable load line as described below.

Figure 3:
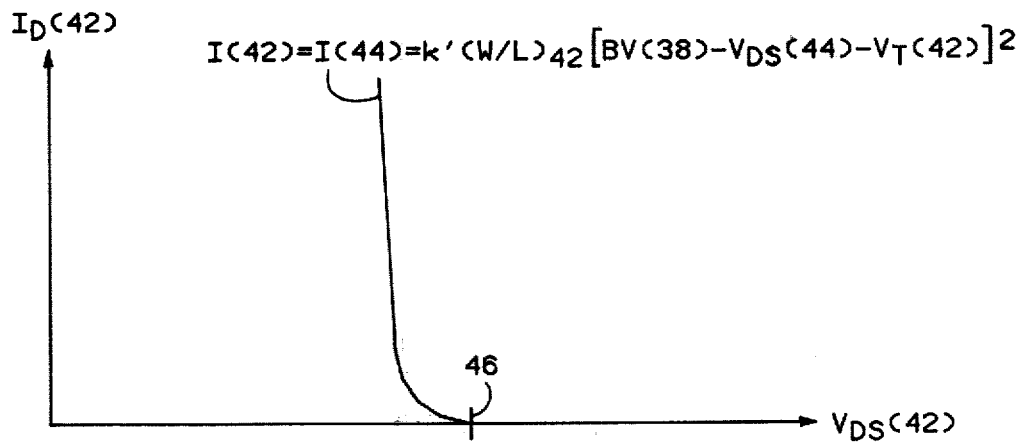
FIG. 3 illustrates a load-line characteristic of the circuit of the invention.

The voltage regulating circuit shown in FIG. 2 presents very favorable load line to the integrated circuit transistors such as transistor 44. A small output current drawn by device 44 will cause a certain voltage drop from gate to source of device 42, but even if transistor 44 is fully turned on, the voltage drop will not be excessive because of the square law characteristic of the output current versus voltage drop from gate to source of device 42. The load line characteristic is illustrated in FIG. 3.

If the threshold voltage of transistor 42 at the source substrate bias established by reference device 38 is slightly negative, the output voltage 46 will be slightly higher than the breakdown voltage of reference device 38. The resulting breakdown current of device 44 would then cause a voltage drop along the load line which in turn limits the breakdown current of device 44 to a safe, non-destructive limit.

Thus there has been provided, in accordance with the invention, a self-tracking breakdown protection circuit that fully meets the objects and advantages set forth above. The circuit allows the application of the maximum non destructive voltage to the integrated circuit devices. While the invention has been described in conjunction with specific embodiments thereof, it is not intended that the invention or its usage be so limited. For example, while circuits have been described in which certain electrodes were noted as being at ground potential, it will be generally recognized that the potential might be ground, near ground, $V_{SS}$, or the like. Accordingly, it is intended to embrace all variations and modifications as fall within the scope of the appended claims.

I claim:

1. A voltage regulator circuit which comprises: current source means connected to a first potential; reference voltage means connected in series with said current source means for establishing a maximum reference voltage, said current source means and said reference voltage means connected between said first potential and a second potential; and a source follower connected to said first potential and to the junction between said current source means and said reference voltage means, the output voltage of said source-follower limited to a voltage less than a preselected voltage.

2. The voltage regulator circuit of claim 1 wherein said current source means comprises a depletion mode MOS transistor.

3. The voltage regulator circuit of claim 1 wherein said reference voltage means comprises a gated junction diode having a grounded gate to reduce the breakdown voltage of said diode.

4. The voltage regulator circuit of claim 1 wherein said source follower is a MOS transistor having source, gate, drain and substrate terminals, and characterized by a threshold voltage of approximately zero volts when said source terminal is reverse biased with respect to said substrate terminal by a voltage approximately equal to said maximum reference voltage, said drain connected to said first potential, said gate connected to said junction between said voltage reference means and said current source means and said source providing said output voltage.

5. A voltage regulating circuit for limiting voltage to a value less than a preselected maximum voltage, said circuit connected between first and second supply potentials, which comprises: a first field effect transistor having source gate and drain electrodes, said drain electrode coupled to said first potential and said gate and source electrode coupled together; voltage reference means serially coupled between said source of said first field effect transistor and said second potential; a second field effect transistor having gate electrode coupled to said source electrode of said first field effect transistor, drain electrode coupled to said first potential, and source electrode limited to said preselected maximum voltage.

6. The voltage regulating circuit of claim 5 wherein said voltage reference means is a gated diode.

7. The voltage regulating circuit of claim 6 wherein said gated diode has a gate electrode held near ground potential.

8. The voltage regulating circuit of claim 5 wherein said second field effect transistor has a threshold voltage of about zero volts.

9. The voltage regulating circuit of claim 5 wherein said first supply potential is an input voltage to said voltage regulating circuit and said second supply potential is approximately ground potential.

10. A self-tracking high voltage breakdown protection circuit comprising: a load device coupled to a voltage input; a gated junction diode voltage reference device coupled to said load device, said load device and said reference device establishing a regulated voltage; and a source follower for coupling said regulated voltage to a circuit device.

* * * * *